(12) United States Patent
Lee (10) Patent No.: US 9,972,370 B2
(45) Date of Patent: May 15, 2018

(54) MEMORY DEVICE WITH SHORTENED PRE-CHARGING TIME FOR BIT-LINE

(71) Applicant: SK hynix Inc., Gyeonggi-do (KR)

(72) Inventor: Nam Jae Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/045,941

(22) Filed: Feb. 17, 2016

(65) Prior Publication Data

US 2017/0084315 A1    Mar. 23, 2017

(30) Foreign Application Priority Data

Sep. 22, 2015 (KR) .................... 10-2015-0134210

(51) Int. Cl.
| | |
|---|---|
| G11C 11/34 | (2006.01) |
| G11C 7/12 | (2006.01) |
| G11C 5/06 | (2006.01) |
| G11C 7/10 | (2006.01) |
| G11C 7/18 | (2006.01) |
| H01L 27/11582 | (2017.01) |

(52) U.S. Cl.
CPC ............ *G11C 7/12* (2013.01); *G11C 5/06* (2013.01); *G11C 7/1057* (2013.01); *G11C 7/18* (2013.01); *H01L 27/11582* (2013.01); *G11C 5/063* (2013.01)

(58) Field of Classification Search
None
See application file for complete search history.

(56) References Cited

U.S. PATENT DOCUMENTS

| | | | |
|---|---|---|---|
| 2009/0267128 A1* | 10/2009 | Maejima ........... | H01L 27/11565 257/314 |
| 2012/0112362 A1* | 5/2012 | Shin ................... | H01L 23/5226 257/774 |
| 2014/0056069 A1* | 2/2014 | Park .................. | G11C 16/0483 365/185.05 |
| 2015/0055414 A1* | 2/2015 | Chen ................. | G11C 16/0483 365/185.12 |
| 2016/0163386 A1* | 6/2016 | Hwang .............. | G11O 5/025 365/185.12 |

FOREIGN PATENT DOCUMENTS

KR          1020120075882         7/2012

\* cited by examiner

*Primary Examiner* — Uyen B Tran
(74) *Attorney, Agent, or Firm* — IP & T Group LLP (57) ABSTRACT

The present disclosure may provide a memory device including a page buffer and bit-lines coupled thereto with a less load of the bit-lines. In one aspect of the present disclosure, there is provided a memory device comprising: bit-lines, each bit-line having opposite first and second ends; plugs coupled respectively to the bit-lines, each plug disposed between and excluding the first and second ends; and a page buffer coupled to the plugs.

20 Claims, 8 Drawing Sheets

MEMORY DEVICE WITH SHORTENED PRE-CHARGING TIME FOR BIT-LINE

CROSS-REFERENCE TO RELATED APPLICATION

The present application claims a priority to a Korean patent application number 10-2015-0134210 filed on Sep. 22, 2015, the entire disclosure of which is incorporated herein in its entirety by reference.

BACKGROUND

Field

The present disclosure relates to a memory device and, more particularly, to a memory device including a page buffer coupled to bit-lines.

Related Arts

A memory device may include a memory cell array for storing data, a peripheral circuit configured to program (write), read and erase data into/from the memory cell array, and a control logic configured to control the peripheral circuit. The memory cell array may include a number of memory blocks, each block including a plurality of memory cells. The peripheral circuit may include page buffers to temporarily store data therein. Each of the page buffers may typically be connected via bit-lines to the memory blocks. It would be desirable to reduce the load of the bit-lines.

SUMMARY

Embodiments of the present disclosure are directed to a memory device including a page buffer and bit-lines coupled thereto with a less load of the bit-lines.

In one aspect of the present disclosure, there is provided a memory device comprising: bit-lines, each bit-line having opposite first and second ends; plugs coupled respectively to the bit-lines, each plug disposed between and excluding the first and second ends; and a page buffer coupled to the plugs.

In one aspect of the present disclosure, there is provided a memory device comprising: a number of memory blocks having a top and a bottom; bit-lines disposed on one of the top and bottom of the memory blocks; a page buffer on the other of the top and bottom of the memory blocks; and plugs vertically extending between the top and bottom of the memory blocks, wherein the page buffer and the bit-lines are coupled to each other via the plugs.

In one aspect of the present disclosure, there is provided a memory device comprising: a memory cell array; bit-lines coupled to the array; and a page buffer including sub-page buffers, each sub-page buffer coupled to each bit-line at a predetermined portion thereof, each sub-page buffer constructed to pre-charge or discharge each bit-line.

In this approach, the bit-lines coupled to the page buffer may have a reduced load which may result in a decrease in a pre-charge or discharge time of the bit-lines. This may lead to an enhanced operation speed of the memory device.

DETAILED DESCRIPTIONS

Various embodiments of the invention are described below with reference to the accompanying drawings. It will be understood that the discussion herein is not intended to limit the claims to the specific embodiments described. On the contrary, it is intended to cover alternatives, modifications, and equivalents as may be included within the spirit and scope of the present disclosure as defined by the appended claims. Rather, these embodiments are provided as examples so that this disclosure will be thorough and complete, and fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, s, operations, elements, and/or components, but do not preclude the presence or addition of one or more other features, integers, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

Figure 1:
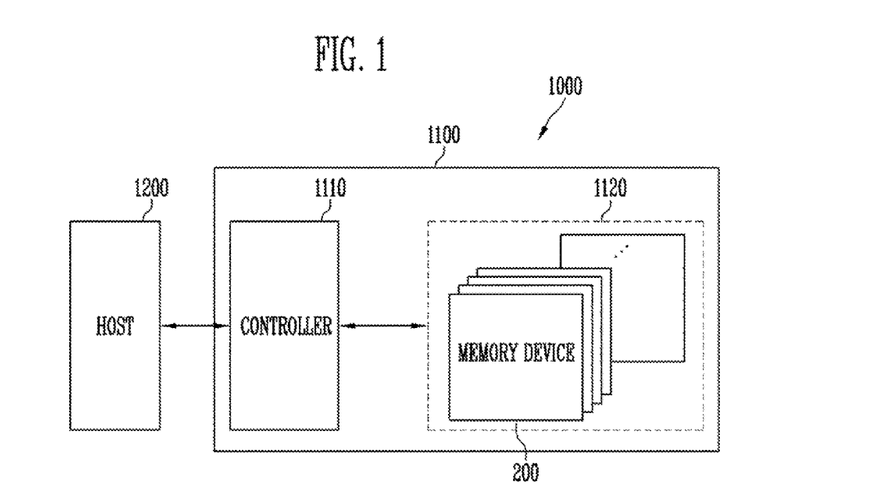
FIG. 1 is a block diagram of a memory system, according to an embodiment of the present disclosure.

FIG. 1 is a block diagram of a memory system 1000, according to an embodiment of the present disclosure.

Referring to FIG. 1, the memory system 1000 may include a storage device 1100 configured to store data therein and, a host 1200 as a user device coupled to the storage device 1100.

The storage device 1100 may include, but be not limited to, SSD (Solid State Disk), SDD (Solid State Drive), PC card (PCMCIA, personal computer memory card international association), compact flash card (CFC), smart media card (SMC), memory stick, multi-media card (MMC, RS-MMC, MMC-micro), SD card (SD, miniSD, microSD, SDHC) or universal flash storage (UFS) or the like.

The host 1200 may include, by way of example, a personal or portable computer, PDA (Personal Digital Assistant), PMP (portable media player), MP3 player or the like. The host 1200 and memory device 1100 may be connected to each other via a standardized interface such as USB, SCSI, ESDI, SATA, SAS, PCI-express, or IDE interface.

The storage device 1100 may include essentially a controller 1110 and a memory group 1120. The controller 1110 may control all of operations of the memory group 1120 and, in response to a command from the host 1200, may output a command, address and data to control the memory group 1120 to the memory group 1120 or receive data from the memory group 1120. The memory group 1120 may include a plurality of memory devices 200. The memory devices 200 each may be configured to program, read and/or erase data thereto or therefrom based on commands and addresses received from the controller 1110. Each of the memory devices 200 may include, but be not limited to a DDR SDRAM (Double Data Rate Synchronous Dynamic Random Access Memory), a LPDDR4 (Low Power Double Data Rate4) SDRAM, a GDDR (Graphics Double Data Rate) SDRAM, a LPDDR (Low Power) DDR, a RDRAM (Rambus Dynamic Random Access Memory) or a flash memory.

Hereinafter, the memory device 200 including a NAND flash memory may be described by way of example.

Figure 2:
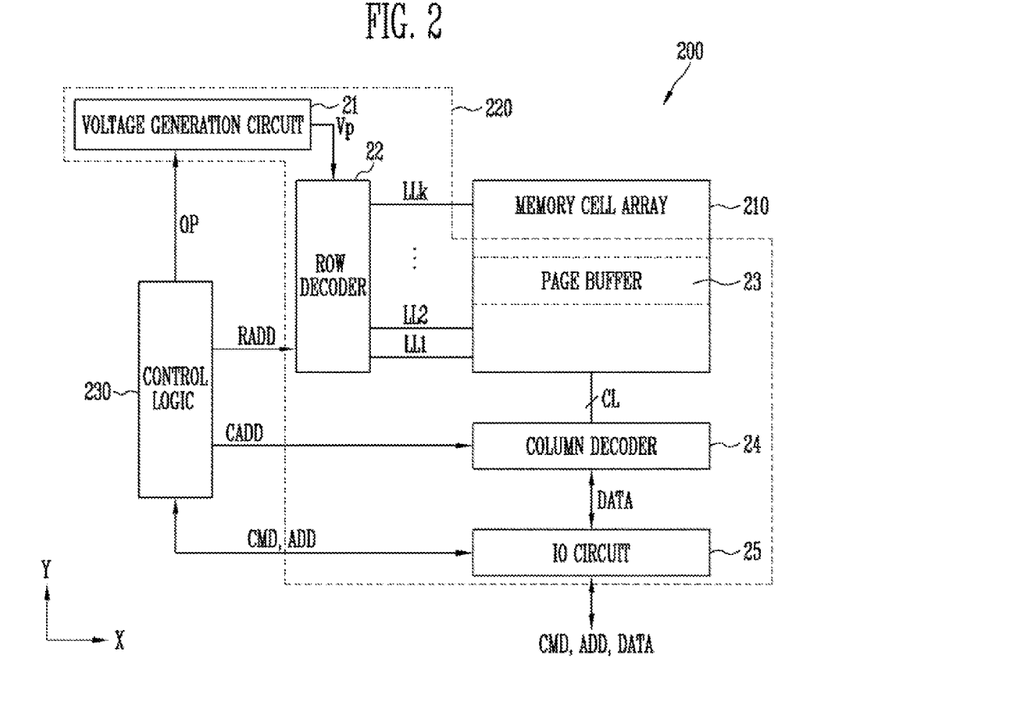
FIG. 2 is a block diagram of a memory device, according to an embodiment of the present disclosure.

FIG. 2 is a block diagram of a memory device according to an embodiment of the present disclosure. In some embodiments, FIG. 2 may be a detailed block diagram of the memory device 200 in FIG. 1.

Referring to FIG. 2, the memory device 200 may include a memory cell array 210 configured to store data therein, a peripheral circuit 220 configured to perform a programming, reading or erasing operation for the memory cell array 210, and a control logic 230 configured to control the peripheral circuit 220.

The memory cell array 210 may include a number of memory blocks. The memory blocks each may include a number of cell strings (not shown). In one example, each string may include a drain select transistor, memory cells and a source select transistor. The string may be coupled to a bit-line BL. The drain select transistor may be coupled, at a gate thereof, to a drain select line DSL. The memory cells may be coupled, at respective gates thereof, to the word lines WL. The source select transistor may be coupled, at a gate thereof, to a source select line SSL.

The peripheral circuit 220 may include a voltage generation circuit 21, a row decoder 22, a page buffer unit 23, a column decoder 24 and an input/output (IO) circuit 25.

The voltage generation circuit 21 may generate a variety of levels of operation voltages Vp in response to a receipt of an operation signal OP, where the operation voltages may be employed for a program, read and erase operations. In one example, upon a receipt of a programming operation signal OP, the voltage generation circuit 121 may generate a programming voltage for the program operation. Upon a receipt of a reading operation signal OP, the voltage generation circuit 121 may generate a reading voltage for the read operation. Upon a receipt of an erasing operation signal OP, the voltage generation circuit 121 may generate an erasing voltage for the erase operation.

The row decoder 22 may deliver the operation voltage Vp to local lines coupled to a memory block selected from among the memory blocks in the memory cell array 210 in response to a receipt of a row address RADD. The local lines may include the drain select lines DSL, word lines WL and source select lines SSL as mentioned above.

The page buffer unit 23 may be connected via bit-lines (not shown) to the memory cell array 210, and may be disposed on a bottom of the memory cell array 210. The page buffer unit 23 may temporarily store therein data under controls of the control logic 230, and may communicate data via the bit-lines with the memory cell array 210. When the bit-lines are disposed on a top of the memory cell array 210, the page buffer unit 23 may be coupled via bit-line plugs (not shown) passing-through the memory cell array 210 to the bit-lines, and then the bit-lines may be coupled to the memory cell array 210. In an alternative, when the bit-lines are disposed between a bottom of the memory cell array 210 and the page buffer unit 23, the page buffer unit 23 may be coupled to a central region of the bit-lines, and the bit-lines may be coupled to the memory cell array 210. Details about connections between the page buffer unit 23, and the bit-lines and the memory cell array 210 may be described later.

The column decoder 24 may communicate data with the page buffer unit 23 and thus the memory cell array 210 in response to a receipt of a column address CADD. The column decoder 24 may communicate data with the input/output circuit 25.

The input/output circuit 25 may be configured to deliver the command CMD and address ADD from an external device (for example, the controller 1110 in FIG. 1) to the control logic 230, or/and to communicate data DATA with the column decoder 24, or to communicate data DATA with the controller 1110.

The control logic 230 may output the operation signal OP, the row address RADD and the column address CADD to control the peripheral circuit 220 in response to the command CMD and the address ADD.

Figure 3:
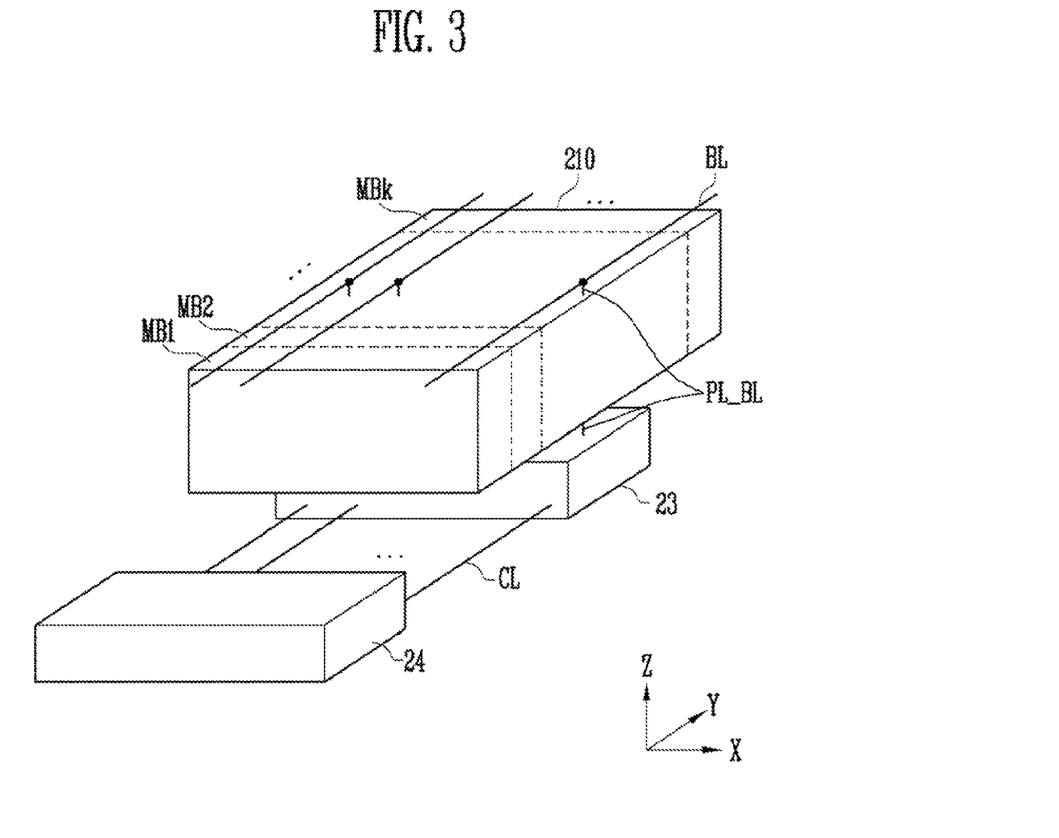
FIG. 3 illustrates connections between a memory cell array, a page buffer unit and a column decoder, according to an embodiment of the present disclosure.

FIG. 3 illustrates connections between a memory cell array, a page buffer unit and a column decoder according to an embodiment of the present disclosure. In some embodiments, FIG. 3 may illustrate connections between the memory cell array 210, the page buffer unit 23 and the column decoder 24 of FIG. 2.

Referring to FIG. 3, the page buffer unit 23 may be disposed on a bottom of the memory cell array 210, and be coupled via column lines CL to the column decoder 24, and be coupled to the memory cell array 210.

In an embodiment, the bit-lines BL may be disposed on a top of the memory cell array 210, and the page buffer unit 23 may be coupled via bit-line plugs PL_BL to the bit-lines BL while the page buffer unit 23 is disposed on a bottom of the memory cell array 210. To this end, each of the bit-line plugs PL_BL may pass vertically through the memory cell array 210 in order to connect the page buffer unit 23 with the each bit-line BL.

In an embodiment, the bit-lines BL may be disposed on a bottom of the memory cell array 210, and the page buffer unit 23 may be coupled via bit-line plugs PL_BL to the bit-lines BL while the page buffer unit 23 is disposed on a top of the memory cell array 210. To this end, each of the bit-line plugs PL_BL may pass vertically through the memory cell array 210 in order to connect the page buffer unit 23 each bit-line BL.

The memory cell array 210 may include first to k-th memory blocks MB1 to MBk, where k is a positive integer larger than 1. The first to k-th memory blocks MB1 to MBk may be arranged in a first direction, that is, in a Y direction. In this case, the bit-line plugs PL_BL may be disposed between two adjacent memory blocks from among the first to k-th memory blocks MB1 to MBk.

In one embodiment, the page buffer unit 23 may be coupled between and excluding both opposite ends of each bit-line BL. In an embodiment, the page buffer unit 23 may be coupled to a central region between both opposite ends of each bit-line BL. In this way, an entire length of each of the bit-lines BL to be pre-charged or discharged may be divided into two lengths, each length being smaller than the entire length. This may lead to suppression of a load increase for each of the bit-lines BL, and thus enhancement in an operation speed thereof. In an embodiment, the page buffer unit 23 may be disposed at a location corresponding to a central region of the memory cell array 210 in the first direction, and each of the bit-line plugs PL_BL may be coupled to each of the bit-lines BL at a central portion thereof in the first direction.

The memory blocks and the page buffer unit 23 may have configurations as will be described below.

Figure 4:
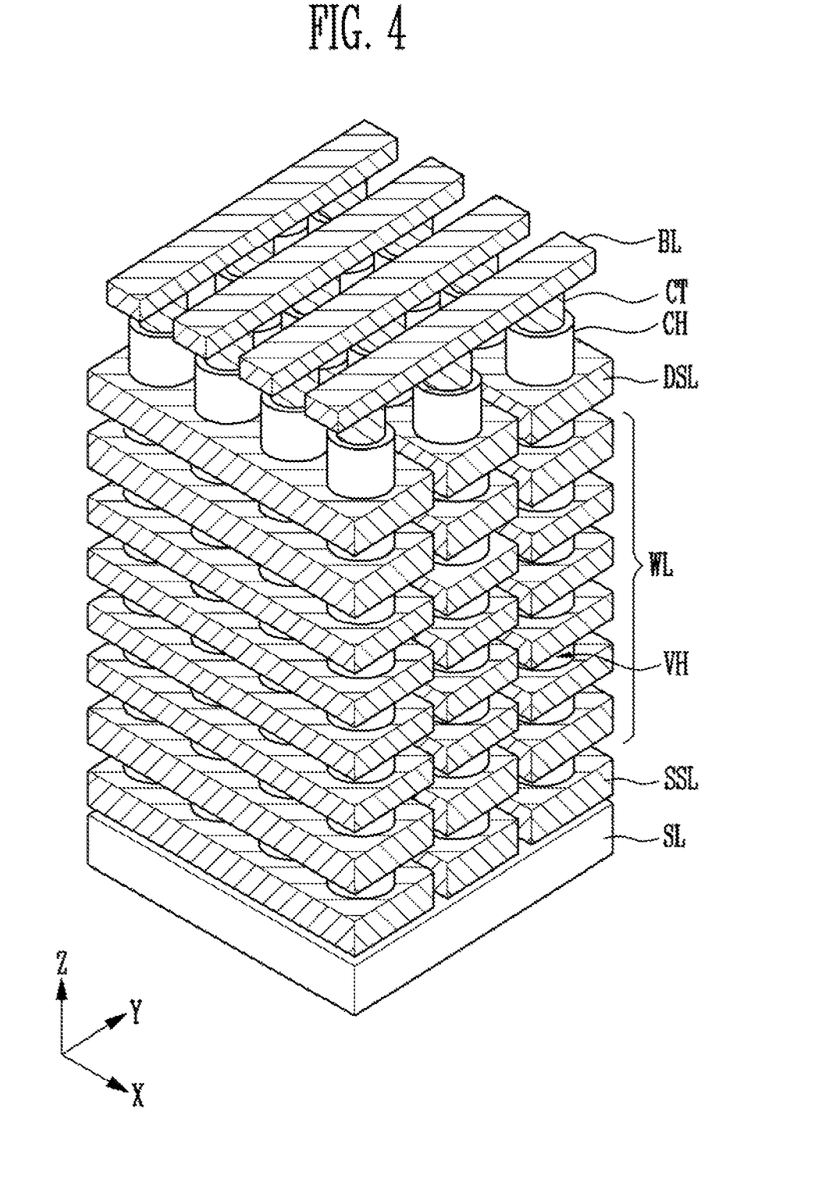
FIG. 4 is a perspective view of a three-dimensional structure of a memory block of a memory device, according to an embodiment of the present disclosure.

FIG. 4 is a perspective view of a three-dimensional (3D) structure of a memory block according to one embodiment of the present disclosure. For example, FIG. 4 may illustrate the structure of the memory blocks of the memory cell array 210 in FIG. 3.

Referring to FIG. 4, a three-dimensional structure of a memory block may be vertically formed in a Z direction on a substrate and may include a horizontal arrangement of vertical I-shape strings, each string disposed between each of bit-lines BL and a common source line SL. This structure may be referred to as "Bit Cost Scalable (BiCS)". In one example, the common source line SL may be formed horizontally on the substrate and, in this case, each of the strings having the BiCS structure may extend vertically upwards from the common source line SL. The strings may be spaced apart at regular intervals along a first direction, namely a Y direction, and each string may include a stack of each of the source select lines SSL, the word-lines WL and each of the drain select lines DSL, all of which are spaced apart from each other in the Z direction. Each string may include each of vertical through-holes VH, each hole passing through each of the source select lines SSL, the word-lines WL and each of the drain select lines DSL. Each of the vertical through-holes VH may be filled with a conductive material to form a plurality of channel pillars CH. Each channel pillar CH may contact the common source line SL. Each source select transistor may be formed between the channel pillar CH and the source select line SSL. Memory cells may be disposed between the channel pillar CH and the word-lines WL. Each drain select transistor may be formed between the channel pillar CH and the drain select line DSL. Although not shown, each string may further include dummy select transistors and/or dummy memory cells.

Each of the bit-lines BL may contact a plurality of Y direction-arranged channel pillars CH at a top of each pillar extending upwards from each of the drain select lines DSL. The bit-lines BL may be spaced apart at regular intervals in a second direction, namely, an X direction perpendicular to the Y direction. Each of the source select lines SSL, the word-lines WL and each of the drain select lines DSL may extend in the second direction. The source select lines SSL may be spaced apart at regular intervals in the first direction. The word-lines WL may be spaced apart at regular intervals in the first direction. The drain select lines DSL may be spaced apart at regular intervals in the first direction. Between each of the bit-lines BL and each of the channel pillars CH, there may be further formed a contact plug CT.

Figure 5:
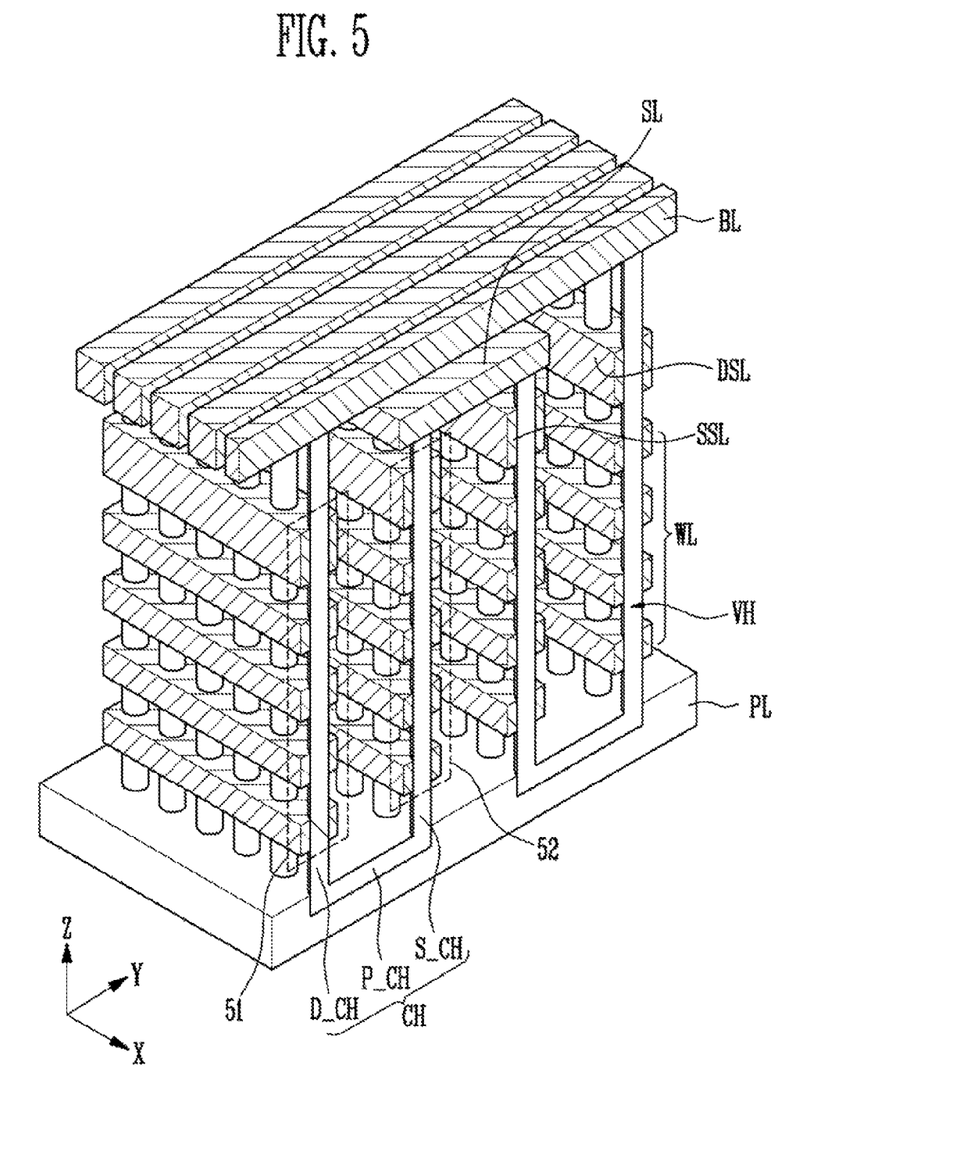
FIG. 5 is a perspective view of a three-dimensional structure of a memory block of a memory, according to another embodiment of the present disclosure.

FIG. 5 is a perspective view of a three-dimensional (3D) structure of a memory block, according to another embodiment of the present disclosure. For example, FIG. 5 may illustrate the structure of the memory blocks of the memory cell array 210 in FIG. 3.

Referring to FIG. 5, the three-dimensional structure of the memory block may be formed vertically, namely, in a Z direction (the third direction) on a substrate, and include a plurality of U-shape strings extending between each of bit-lines BL and a common source line SL and each of pipe structures, each pipe structure connecting two strings.

To be more specific, each string may be configured such that a first sub-string 51 may vertically extend between the bit-line BL and a pipe line PL, a second sub-string 52 may vertically extend between the common source line SL and the pipe line PL, and the first and second sub-strings 51, 52 may be connected each other via the pipe line PL. This structure may be referred to as Pipe-shaped Bit Cost Scalable (P-BiCS).

In one example, the pipe line PL may be horizontally formed on the substrate and, in this case, each of the strings having the P-BiCS structure may include the first sub-string 51 vertically extending between the bit-line BL and the pipe line PL, and the second sub-string 52 vertically extending between the common source line SL and the pipe line PL.

The first sub-strings 51 may be spaced apart in the first direction (Y direction). Each first sub-string 51 may include a vertical (Z direction) spaced-arrangement of the word-lines WL, each of drain select lines DSL and, each of first channel pillars D_CH. The word-lines WL may be spaced apart at regular intervals in the first direction (Y direction) and each word-line WL may extend in the second direction (X direction). The drain select lines DSL may be space apart at regular intervals in the first direction (Y direction) and each drain select line DSL may extend in the second direction (X direction). The pillar may fill the vertical through-hole VH passing through the word-lines WL and the drain select line DSL. The first and second sub-strings 51, 52 may be spaced apart at regular intervals along the first direction (Y direction) in an alternating manner. Each second sub-string 52 may include a vertical spaced-arrangement of the word-lines WL, each of source select lines SSL and, each of second channel pillars S_CH. Similarly, the word-lines WL may be spaced apart at regular intervals in the first direction (Y direction) and each word-line WL may extend in the second direction (X direction). The source select lines SSL may be spaced apart at regular intervals along the first direction (Y direction) and each source select SSL may extend in the second direction (X direction). The pillar S_CH may fill the vertical through-hole VH passing through the word-lines WL and the source select line SSL.

The memory cells may be formed between the first pillar D_CH and the word-lines WL and between the second pillar S_CH and the word-lines WL. A source select transistor may be formed between the second pillar S_CH and the source select line SSL. A drain select transistor may be formed between the first pillar D_CH and the drain select line DSL.

The first channel pillar D_CH and second channel pillar S_CH may be connected to each other via each of the pipe channel pillars P_CH formed in the pipe line PL. Each of the bit-lines BL may contact a top of each of the first channel pillars D_CH, each top vertically extending upwards from each of the drain select lines DSL. The bit-lines BL may be spaced apart at regular intervals along the first direction (Y direction), while each bit-line may extend in a second direction perpendicular to the first direction. The source line SL may extend in the second direction (X direction). The source line SL may contact a top of each of the second channel pillars S_CH, each top vertically extending upwards from each of the source select lines SSL.

Figure 6:
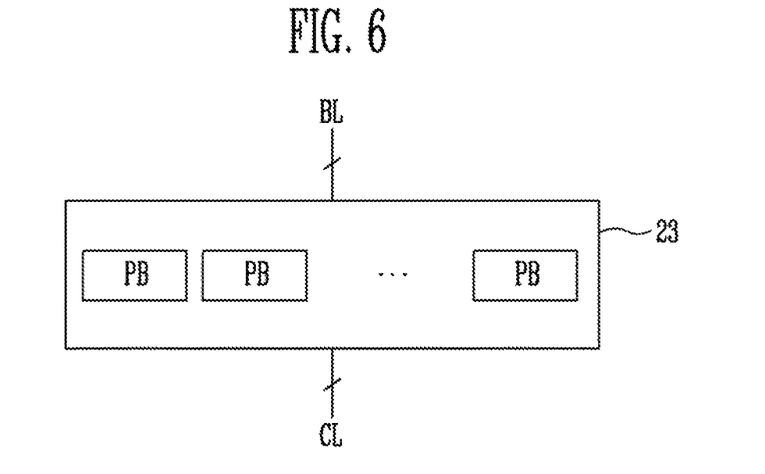
FIG. 6 is a diagram illustrating a page buffer unit of a memory device, according to an embodiment of the present disclosure.

FIG. 6 is a diagram illustrating a page buffer unit, according to an embodiment of the present disclosure. In some embodiments, FIG. 6 may schematically illustrate the page buffer unit 23 in FIG. 2.

Referring to FIG. 6, the page buffer unit 23 may be connected via the bit-lines BL to the memory cell array 210 in FIG. 3. The page buffer unit 23 may be coupled via the column lines CL to the column decoder 24 in FIG. 3. The memory cell array 210 may include a number of the memory blocks, and the memory blocks may share each of the bit-lines BL.

The page buffer unit 23 may include a number of page buffers PB. Each page buffer PB may temporarily store therein data, and deliver the temporally stored data to the bit-lines BL. Each page buffer PB may receive data via the bit-lines BL from a selected memory block.

The page buffers PB may have the same configuration. Hence, only a single page buffer PB will be exemplified herein with respect to its configuration.

Figure 7:
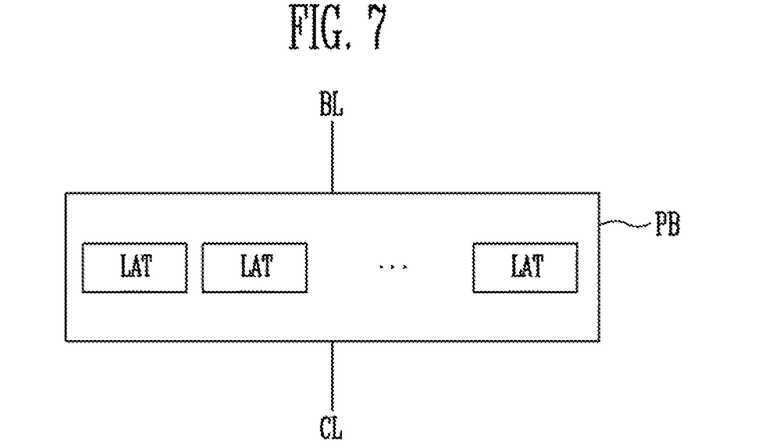
FIG. 7 is a diagram illustrating a page buffer unit of a memory device, according to another embodiment of the present disclosure.

FIG. 7 is a diagram illustrating a page buffer according to an embodiment of the present disclosure. In some embodiments, FIG. 7 schematically may illustrate the page buffer of the page buffer unit 23 in FIG. 6.

Referring to FIG. 7, the page buffer PB may include a number of latches LAT to temporarily store therein data. For example, in a programming operation, the page buffer PB may temporarily store data received via column line CL into a latch LAT and deliver the data in the LAT via bit-line BL to a selected memory block. In a reading operation, the page buffer PB may temporarily store data received via bit-line BL from a selected memory block into latch LAT and deliver the data in the LAT to the column line CL. The page buffer PB may pre-charge or discharge the bit-line BL in a program, read or erase operation.

Figure 8:
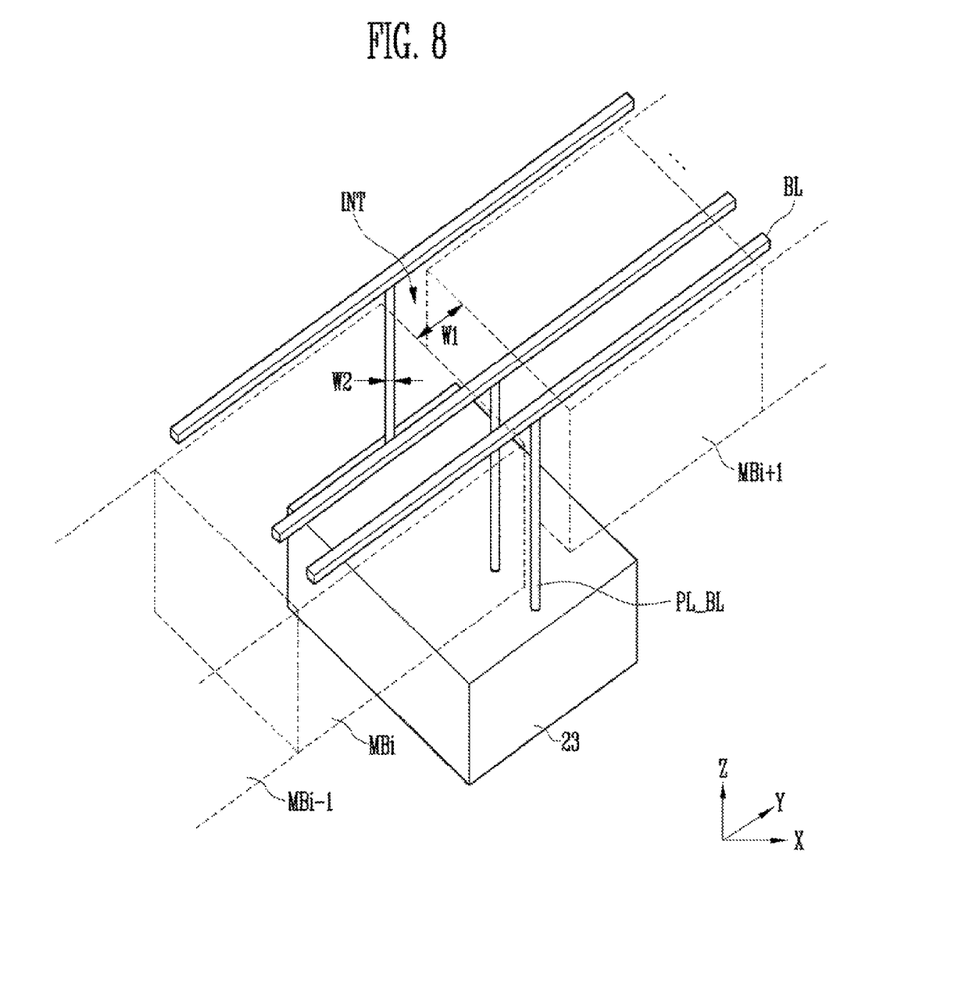
FIG. 8 is a perspective view illustrating in more detail connections between a page buffer unit and bit-lines, according to an embodiment of the present disclosure.

FIG. 8 is a perspective view illustrating in detail connections between a page buffer unit and bit-lines, according to an embodiment of the present disclosure. For example, FIG. 8 may illustrate connections between the page buffer unit 23 and bit-lines in FIG. 2.

Referring to FIG. 8, the page buffer unit 23 may be coupled via the bit-line plugs PL_BL to the bit-lines BL. The bit-line plugs PL_BL may be disposed between two neighboring memory blocks. In an embodiment, between an i-th memory block MBi ("i" is a positive integer smaller than k) and an (i+1)-th memory block MBi+1, there may be disposed the bit-line plugs PL_BL. Each of the bit-line plugs PL_BL may be coupled to each of the bit-lines BL. The bit-line plugs PL_BL may extend perpendicularly with a plane of the bit-lines BL. The bit-line plugs PL_BL may extend to the page buffer unit 23. In an embodiment, in order to reduce a load of the bit-lines BL, the i-th memory block MBi ("i" is a positive integer smaller than k) and the (i+1)-th memory block MBi+1 may be disposed in a central region of the memory cell array in a longitudinal direction of the array. The present disclosure may not be limited thereto. In this figure, the region between the i-th memory block MBi ("i" is a positive integer smaller than k) and the (i+1)-th memory block MBi+1 may be referred to as a "boundary region" INT.

In an embodiment where the bit-line plugs PL_BL are disposed between the i-th memory block MBi and the (i+1)-th memory block MBi+1, in order to minimize a vertical length of each of the bit-line plugs PL_BL, the page buffer unit 23 may be disposed just under the boundary region INT.

Assuming that the boundary region INT has a first width W1, and each of the bit-line plugs PL_BL has a second width W2, the first width W1 may be larger than the second width W2. In one example, the first width W1 may be larger than 1.5 times the second width W2. The bit-line plugs PL_BL may electrically connect exclusively the page buffer unit 23 to each bit line BL. Thus, the boundary region INT may be filled with an insulating material except for the bit-line plugs PL_BL.

Figure 9:
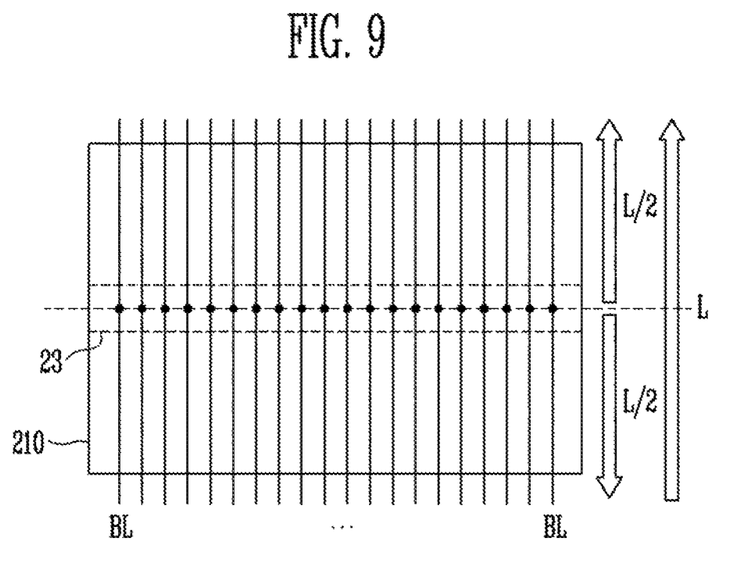
FIG. 9 illustrates an example of connections between a page buffer unit and bit-lines, according to an embodiment of the present disclosure.

FIG. 9 illustrates an example of connections between a page buffer and bit-lines, according to an embodiment of the present disclosure. For example, FIG. 9 may illustrate connections between the page buffer unit 23 and each of the bit-lines in FIG. 2.

Referring to FIG. 9, the pager buffer unit 23, and more specifically, the page buffers PB (FIG. 6 and FIG. 7) may be connected respectively to the bit-lines BL at any point between and excluding opposite first and second ends of the bit-line BL. That is, the page buffer may not be coupled to the first and/or second ends of the bit-line BL.

Although, the page buffer may be coupled exactly to the first or second end of the bit-line BL, in preferred embodiments the page buffer 23 is disposed between the first and second ends of the bit-line BL and excludes the first and second ends of the bit-line BL. This way a length from an intersection of the bit-line BL and the page buffer unit 23 to the first or second end of the bit-line BL may be shortened. More specifically, where the page buffer is coupled to, for example, the first end (or second end) of the bit-line BL, a length of the bit-line BL to be pre-charged or discharged in a single direction may correspond to a distance L between the first end and second end and in order to pre-charge the bit-line BL, a pre-charge current from the page buffer unit 23 should travel the entire distance L from the first end to the second end of the bit-line BL in a single direction.

By disposing the page buffer unit 23 between the first and second ends of the bit-line BL and excluding the first and second ends of the bit-line BL, a length of the bit-line BL to be pre-charged or discharged in either direction may be smaller than the distance L between the first end and second end. For example, the entire length may be divided into two portions, each portion length being smaller than the entire length. In one example, the page buffer unit 23 may be connected to the bit-line BL at a central portion between the first end and second end of the BL. In this case, a length of the bit-line BL to be pre-charged in either direction may correspond to a one half of the total length of each bit line (L/2 length). Although the total length of the bit line to be pre-charged is equal to the total length of each bit line, the time necessary to pre-charge the entire bit-line may be shortened. This is because instead of the pre-charge current travelling along the L distance in a single direction it only travels along the L/2 distance in both directions (for example, a direction from the central portion to the first end and a direction from the central portion to the second direction). This may lead to a reduction of the pre-charge time relative to existing devices, due to a division of the pre-charging load. Further, the pre-charging speed of the memory device may be enhanced. The same will apply equally to a discharge operation or to a data transmission from the page buffer to the memory cell array.

In this way, the load of the bit-line BL may be reduced and thus the operation speed and performance of the memory device may improve.

Figure 10:
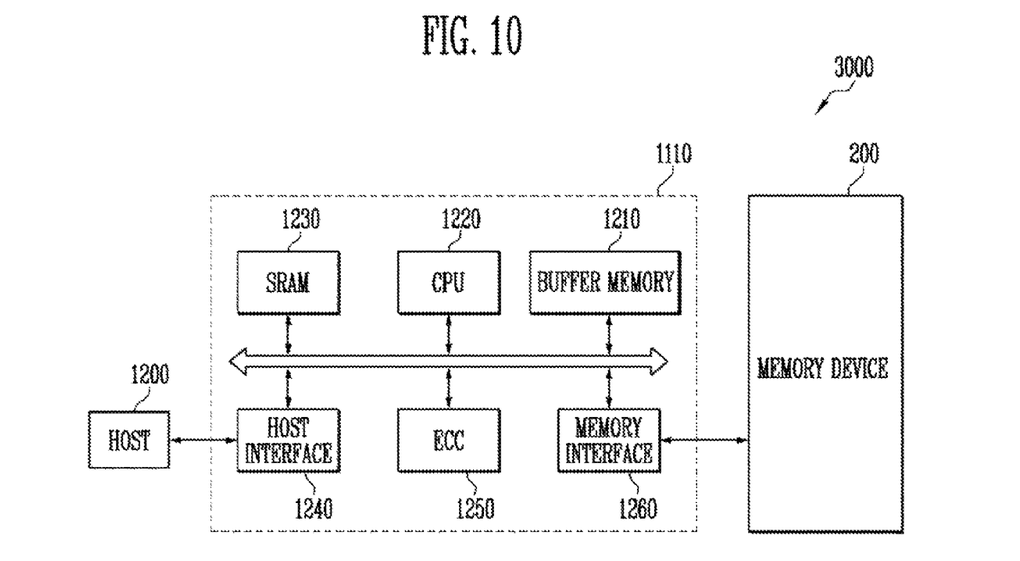
FIG. 10 is a block diagram of a memory system, according to an embodiment of the present disclosure.

FIG. 10 is a block diagram of a memory system 3000, according to one embodiment of the present disclosure. For example, the computing system 4000 may include the memory device 200 and the memory controller 1100 in FIG. 1.

Referring to FIG. 10, the memory system 3000 according to an embodiment of the present disclosure may include the memory device 200 to store therein data, and the memory controller 1100 to control the memory device 200. Further, the memory controller 1100 may control a communication between a host 1200 and the memory device 200. The memory controller 1100 may include a buffer memory 1210, a central processing unit (CPU) 1220, static random access memory (SRAM) 1230, a host interface 1240, an error correction code (ECC) module 1250 and a memory interface 1260.

The buffer memory 1210 may temporarily store therein data during the memory controller 1110 controls the memory device 200. The CPU 1220 may control data exchange for the memory controller 1100. The SRAM 1230 may act as a work memory for the CPU 1220. The host interface 1240 may have a data exchange protocol for the host 1200 coupled to the memory system 3000. ECC module 1250 may detect and correct an error in data read from the memory device 200. The memory interface 1260 may interface with the memory device 200. Further, it may be appreciated by the skilled person to the art that, as not shown in the figure, the memory system 3000 according to the present disclosure may be further provided with a ROM (not shown) to store code data to interface with the host system or host 1200.

In one embodiment, the host 1200 working together with the memory system 3000 may include, but not be limited to, a computer, UMPC (Ultra Mobile PC), workstation, netbook, PDA (Personal Digital Assistants), portable computer, web tablet, wireless phone, mobile phone, smart phone, e-book, PMP (portable multimedia player), portable game player, navigation device, black box, digital camera, 3-dimensional television, digital audio recorder, digital audio player, digital picture recorder, digital picture player, digital video recorder, digital video player, device with a wireless data communication, at least one electronic device as a home networking component, at least one electronic device as a computer networking component, at least one electronic device as a telematics networking component, at least one electronic device as a computing system component, or the like.

Figure 11:
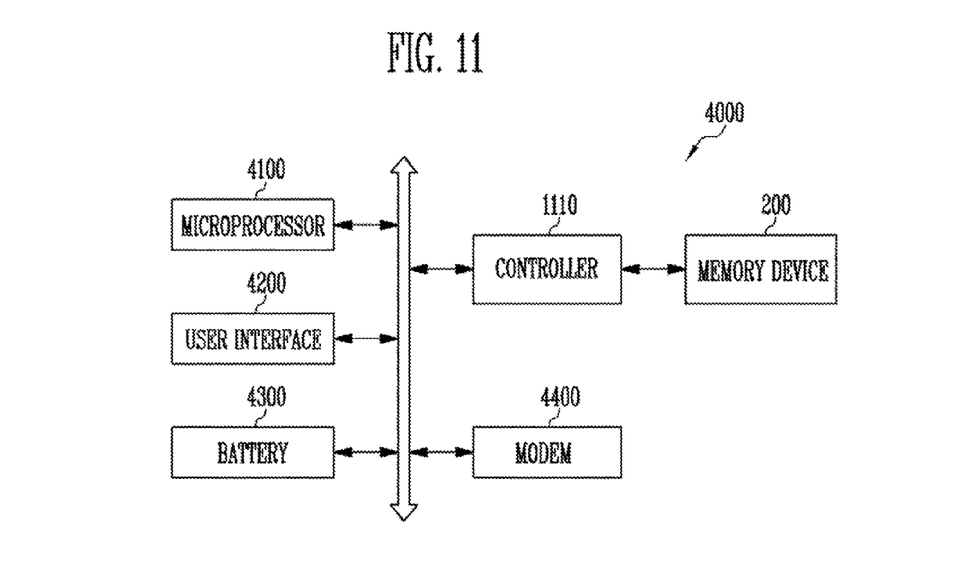
FIG. 11 is a schematic of a computing system including a memory system, according to an embodiment of the present disclosure.

FIG. 11 is a schematic of a computing system 4000 including a memory system according to an embodiment of the present disclosure. For example, the computing system 4000 may include the memory device 200 and the memory controller 1100 in FIG. 1.

Referring to FIG. 11, the computing system 4000 according to one embodiment of the present disclosure may include the memory device 200, the memory controller 1100, a microprocessor 4100, a user interface 4200 and a modem 4400, all of which are electrically connected to each other via a system bus. Further, when the computing system 4000 is implemented in a mobile device, the computing system 4000 may be further provided with a battery 4300 to supply an operation voltage thereof. It may be appreciated that the computing system 4000 may be further provided with an application chipset, camera image processor (CIS), mobile DRAM, etc. The memory controller 1100 and the memory device 200 together may form a SSD (Solid State Drive/Disk).

In one implementation, the memory system (1100 and 200) in the computing system 4000 may be packaged in various forms. For example, such packages may include, but not be limited to, PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP) or the like.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:
1. A memory device comprising:
 a plurality of bit-lines coupled to a memory cell array, each bit-line having opposite first and second ends and extending in a first direction to have a predetermined length;
 a page buffer; and a plurality of plugs, each of the plurality of plugs coupling each of the plurality bit-lines to the page buffer, each plug being disposed between and excluding the first and second ends, wherein each of the plugs is disposed at a central portion of an entire length of each of the bit-lines between the first and second ends of each of the bit-lines so that a length of each of the bit-lines to be pre-charged or discharged in either direction away from the central portion is less than the entire length of each of the bit-lines.

2. The device of claim 1, wherein each of the bit-lines extends in the first direction, and the bit-lines are spaced apart at regular intervals along a second direction, the first and second directions being perpendicular with each other.

3. The device of claim 2, wherein the plugs are spaced apart at regular intervals along the second direction, and each of the plugs extends perpendicularly relative to a plane of the bit-lines.

4. The device of claim 1, wherein a first length from an intersection of a bit-line among the bit-lines and the page buffer to the first end of the bit-line is equal to a second length from the intersection of the bit-line and the page buffer to the second end of the bit-line.

5. A memory device comprising:
a number of memory blocks having a top and a bottom and being arranged in a first direction;
bit-lines coupled to the memory blocks and disposed on one of the top and bottom of the memory blocks, each of the bit-lines extending in the first direction to have a predetermined length;
a page buffer on the other of the top and bottom of the memory blocks; and
plugs vertically extending between the top and bottom of the memory blocks,
wherein the page buffer and the bit-lines are coupled to each other via the plugs, and
wherein each of the plugs is disposed at a central portion of an entire length of each of the bit-lines so that a length of each of the bit-lines to be pre-charged or discharged in either direction away from the central portion is less than the entire length of each of the bit-lines.

6. The device of claim 5, wherein the plugs are disposed between neighboring memory blocks among the memory blocks.

7. The device of claim 5, wherein each of the memory blocks comprises three-dimensional strings.

8. The device of claim 7, wherein each of the three-dimensional strings has one of I shape and U shape.

9. The device of claim 5, wherein the memory blocks share each of the bit-lines.

10. The device of claim 5, wherein the page buffer includes sub-page buffers, each sub-page buffer coupled to each bit-line.

11. The device of claim 5, wherein each of the plugs is disposed at a predetermined portion between opposite first and second ends of each of the bit-lines.

12. The device of claim 5, wherein each of the plugs is disposed at a central portion between the first and second ends of each of the bit-lines.

13. The device of claim 5, wherein each of the bit-lines has opposite first and second ends, and
wherein a first length from an intersection of a bit-line among the bit-lines and the page buffer to the first end of the bit-line is equal to a second length from the intersection of the bit-line and the page buffer to the second end of the bit-line.

14. A memory device comprising:
a memory cell array;
bit-lines coupled to the memory cell array, each of the bit-lines extending in a first direction to have a predetermined length; and
a page buffer including sub-page buffers each sub-page buffer being constructed to pre-charge or discharge each bit-line,
wherein each of the sub-page buffers is coupled to a central portion of an entire length of each of the bit-lines so that a length of each of the bit-lines to be pre-charged or discharged in either direction away from the central portion is less than the entire length of each of the bit-lines.

15. The device of claim 14, wherein each sub-page buffer is coupled to each bit-line at a central portion thereof.

16. The device of claim 14, wherein the page buffer is disposed on one of a bottom and a top of the memory cell array.

17. The device of claim 16, wherein the bit-lines are disposed on the other of the bottom and the top of the memory cell array.

18. The device of claim 17, wherein the bit-lines are disposed on the bottom of the memory cell array, wherein the page buffer is disposed under the bit-lines.

19. The device of claim 17, wherein the bit-lines are disposed on the top of the memory cell array, wherein the page buffer is disposed on the bottom of the memory cell array.

20. The device of claim 14, further comprising:
plugs, each plug electrically connecting each sub-page buffer and each bit-line with each other.

* * * * *